(12) United States Patent
Xu et al.

(10) Patent No.: US 7,368,786 B2
(45) Date of Patent: May 6, 2008

(54) PROCESS INSENSITIVE ESD PROTECTION DEVICE

(75) Inventors: Hongzhong Xu, Gilbert, AZ (US); Richard T. Ida, Chandler, AZ (US); Vijay Parthasarathy, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 417 days.

(21) Appl. No.: 11/078,026

(22) Filed: Mar. 11, 2005

(65) Prior Publication Data
US 2006/0202265 A1    Sep. 14, 2006

(51) Int. Cl.
*H01L 23/58* (2006.01)
*H01L 29/78* (2006.01)

(52) U.S. Cl. .................. 257/343; 257/341; 257/360
(58) Field of Classification Search ........... 257/355, 257/356, 357, 360, 361, 362, E27.06; 361/91.5, 361/111
See application file for complete search history.

(56) References Cited

U.S. PATENT DOCUMENTS

2004/0159891 A1*    8/2004    Nakamura et al. .......... 257/355

OTHER PUBLICATIONS

Parthasarathy et al., "A Double RESURF LDMOS with Drain Profile Engineering for Improved ESD Robustness," IEEE Electron Device Letters, vol. 23, No. 4, Apr. 2002, pp. 212-214.
Parthasarathy et al., "Drain Profile Engineering of RESURF LDMOS Devices for ESD Ruggedness," IEEE Power Semiconductor Devices and ICs, 2002, pp. 265-268.

* cited by examiner

*Primary Examiner*—Lynne Gurley
*Assistant Examiner*—Andrew O. Arena
(74) *Attorney, Agent, or Firm*—Ingrassia, Fisher & Lorenz, P.C.

(57) ABSTRACT

Methods and apparatus for ESD protection of LDMOS devices are provided. The apparatus comprises two LDMOS devices, with source, drain and gate contacts parallel coupled. One is the protected device and the other is the protecting device. Each has source region, drain region, gate, first body well region containing the source, second body well region containing the drain and separated from the first body well region by a drift region, an isolation region separated from the first and second body well regions and a buried layer contacting the isolation region. The protecting device has a further region of the same type as the drain, coupling the drain to the isolation region. Its drain connection is made via a contact to its isolation region rather than its drain region. The drift region of the protecting device is desirably smaller and the isolation-body well separation larger than for the protected device.

19 Claims, 4 Drawing Sheets

PROCESS INSENSITIVE ESD PROTECTION DEVICE

TECHNICAL FIELD

The present invention generally relates to protecting semiconductor devices from electrostatic discharge (ESD), and more particularly to ESD protection of laterally diffused metal-oxide-semiconductor (LDMOS) devices.

BACKGROUND

LDMOS devices are widely used electronic devices, especially in applications requiring significant power handling capability and as output devices. One of the limitations of LDMOS and similar devices is their sensitivity to electrostatic discharge and similar transients, collectively referred to herein by the acronym "ESD". It is known to use various shunting devices across the output of LDMOS and other semiconductor devices to clamp the voltage appearing thereon to a level below the destructive breakdown voltage of the device. Zener diodes and various types of parasitic semiconductor devices are often employed for this purpose. While such devices may some provide ESD protection for LDMOS devices, they suffer from a number of limitations. For example, the current handling capability of a protective ESD device may be inadequate, it may consume too much area on the device or integrated circuit (IC), it may require a different processing technology that what is used to build the rest of the device or IC, the response time of the ESD device may be too slow to protect against fast transients, the ESD device may show undesirable aging wherein its ability to sustain further transients slowly degrades with time, the properties of the ESD device may undesirably vary with fluctuations inherent in the manufacturing process thereby reducing the overall yield of good devices or ICs, the ESD device may interfere with normal operation of the device or IC it is intended to protect, and so forth. All of these and other limitations may be encountered, depending upon the type of ESD protection device intended to be employed with a particular IC or power device and the semiconductor processing and device technology being used. Accordingly, there is an ongoing need for improved ESD protection devices, especially for use with LDMOS devices and particularly with open-drain LDMOS devices.

Accordingly, it is desirable to provide improved ESD protection for semiconductor devices, especially for LDMOS devices. It is desirable that the means and method for providing ESD protection be process insensitive, that is, the ESD devices be equally or less susceptible to manufacturing process variations than the device or IC being protected. In addition, it is desirable that the means and method for providing ESD protection not require additional and/or more costly manufacturing steps or add a significant area burden to the IC or device being protected. In addition, it is desirable that the ESD device has electrical properties generally compatible with the device or circuit being protected. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
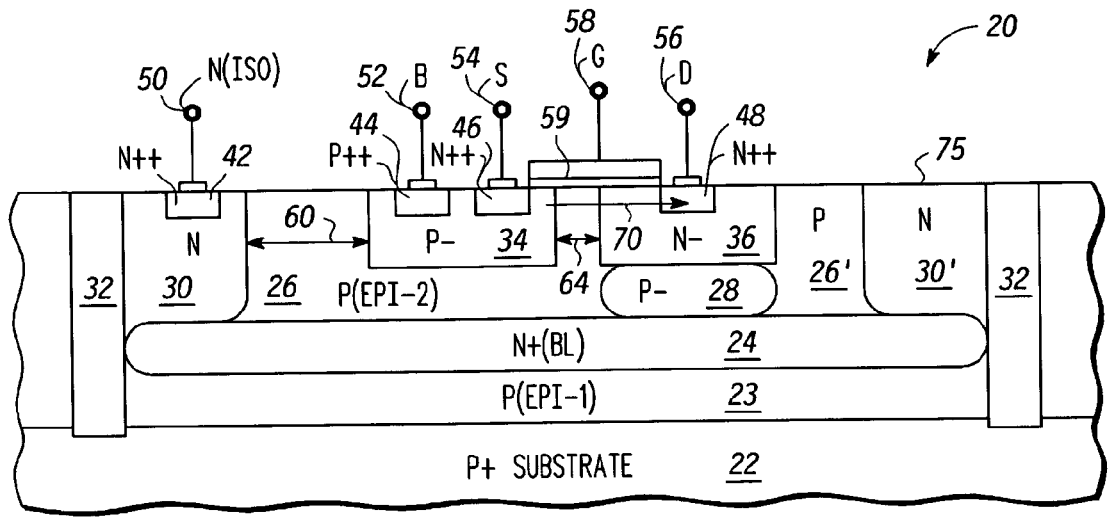
FIG. 1 is a simplified schematic cross-sectional view through a conventional LDMOS device desired to be protected from ESD effects.

FIG. 1 is a simplified schematic cross-sectional view through conventional LDMOS device 20 desired to be protected from ESD effects. Device 20 comprises $P^+$ substrate 22 on which is deposited lightly doped $P^-$ EPI layer 1 (hereafter P(EPI-1)) identified by reference number 23, above which lies $N^+$ buried layer 24, and above which lies P EPI layer 2 (hereafter P(EPI-2)) identified by reference number 26. Portion 26' between $N^-$ well 36 and N isolation region 30' is also part of P(EPI-2). P(EPI-2) layer 26, 26' is referred to as the body of the device. P(EPI-1) 23 has a doping concentration of about 1E14, $N^+$ buried layer 24 has a peak doping concentration of about 1E19, and P(EPI-2) has an average concentration of about 5E15. All doping concentrations are per cubic centimeter. Layers or regions 22, 23, 24, 26 are conventional. Layers 23, 24, 26 are laterally terminated by dielectric filled deep trench_ isolation walls 32. Deep N isolation regions 30, 30' are provided adjacent isolation walls 32 at the periphery of P(EPI-2 body layer 26, 26'. N regions 30, 30' extend from surface 75 through P(EPI-2) body layer 26, connect to $N^+$ buried layer 24 and form a circumferential diffused and/or implanted N type isolation wall surrounding P(EPI-2) body region 26, 26'. N regions 30, 30' have a peak concentration slightly below surface 75 in the range 5E17 to 1E18. $N^{++}$ region 42 is provided in N region 30 to make contact to N region 30, 30' and via N region 30, 30' to buried layer 24. Metalized N(ISO) contact 50 on $N^{++}$ region 42 provides electrical connection to N isolation region 30, 30' and hence to buried layer 24. Although contacts 50, 52, 54, 56, 58 are referred to as a metalized contacts, this is merely for convenience of description. Persons of skill in the art will understand that contacts 50, 52, 54, 56, 58 can be formed from any highly conducting material, as for example and not intended to be limiting, various metals, doped semiconductors, semi-metals and so forth, in pure or alloyed or layered form. Accordingly, as used herein, the words "metal" and "metalized" are intended to include these and other alternatives well known in the art.

P⁻ body well 34 and N⁻ body well 36 laterally separated by distance 64 are provided in P(EPI-2) body region 26, 26'. Distance 64 is referred to as the "drift length" or "drift distance" abbreviated as "DL" 64. P⁻ body well region 34 is separated from N isolation wall 30 by lateral distance 60. Distance 60 is referred to as the isolation-body well spacing, distance or length, abbreviated as "IBS" 60. Buried P⁻ layer 28 is desirably but not essentially provided under N⁻ body well 36 extending vertically between N⁻ well 36 and N⁺ buried layer 24. P⁺⁺ region 44 with contact 52 is provided in P⁻ body well 34. Contact 52 is referred to as the body contact, abbreviated by "B" in FIGS. 1-2. N⁺⁺ region 46 with contact 54 is also provided in P⁻ body well 34. N⁺⁺ region 48 with contact 56 is provided in N⁻ body well 36. N⁺⁺ region 46 acts as the source (S) of the LDMOS device and N⁺⁺ region 48 acts as the drain (D) of the LDMOS device. The channel is formed under gate 58 and insulating layer 59 which overlie P⁻ region 34 and P(EPI-2) body layer 26 across drift space 64 between body wells 34, 36. P⁻ body well 34 and N⁻ body well 36 have peak doping levels of about 1E16 to 5E16.

Figure 2:
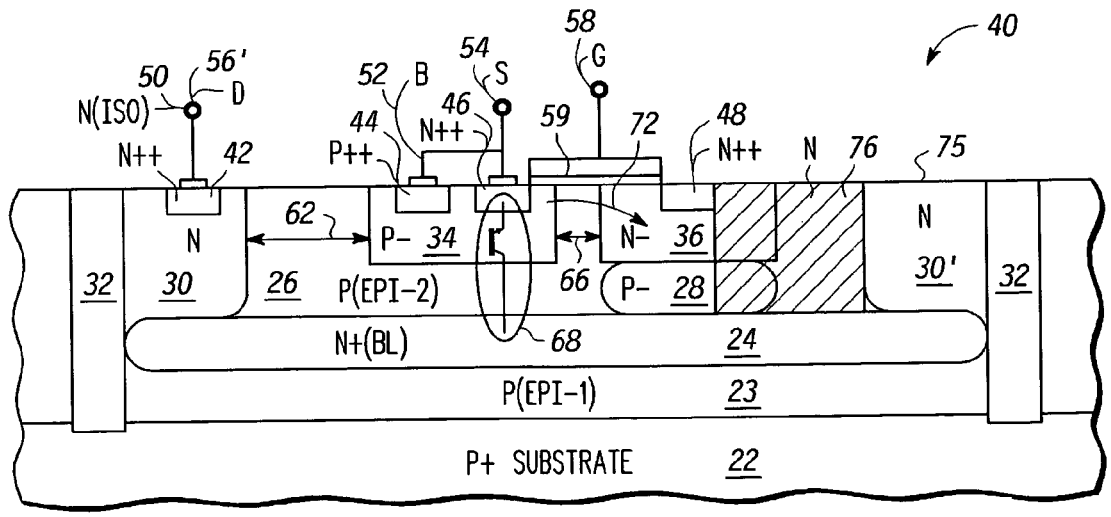
FIG. 2 is a simplified schematic cross-sectional view through an ESD device according to the present invention, intended to protect the LDMOS device of FIG. 1.

FIG. 2 is a simplified schematic cross-sectional view through ESD device 40 of the present invention. Device 40 of FIG. 2 is intended to protect LDMOS device 20 of FIG. 1 or equivalent. ESD device 40 is also an LDMOS device and is preferably made at the same time, on the same substrate and by the same process as LDMOS 20 using the same number of masking layers. This is highly advantageous since it simplifies the manufacturing process and provides the process variation insensitivity that is a particular feature of the present invention. The same reference numbers are used to identify like regions in FIGS. 1 and 2 and, unless specifically noted otherwise, the various regions have the same general configurations and doping profiles. Accordingly, the description of the various layers and regions provided in connection with FIG. 1 is incorporated herein by reference. ESD LDMOS device 40 differs from conventional LDMOS device 20 in several important respects.

(i) First, N region 76 is provided extending laterally approximately from N⁺⁺ contact region 48 to N isolation region 30' and substantially from surface 75 through P(EPI-2) region 26' and part of P⁻ region 28 to buried layer 24 (N region 76 is hatched in FIG. 2 so that it may be readily seen), and with a peak sub-surface concentration of about 5E17 to 1E18;

(ii) Second, drain contact 56 is removed from N⁺⁺ region 48 and N(ISO) contact 50 is used as the drain contact (identified hereafter as drain contact 56') for the ESD device;

(iii) Third, carrier drift length 66 between P⁻ body well 34 and N⁻ body well 36 is desirably made smaller than corresponding drift length 64 of device 20 of FIG. 1; and (iv) Fourth, isolation-body well separation (IBS) 62 between N isolation region 30 and P⁻ well 34 is desirably but not essentially made larger than corresponding isolation-body well separation (IBS) 60 of device 20 of FIG. 1.

These differences in structure make it possible to provide especially effective ESD protection device 40 that is process compatible with LDMOS device 20 and insensitive to process variations.

Figure 3:
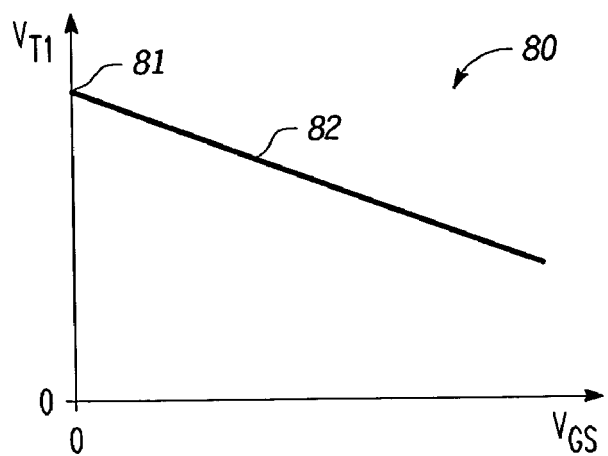
FIG. 3 is a simplified plot of the variation of LDMOS device breakdown trigger voltage Vt1 as a function of the gate voltage Vgs applied to the LDMOS device.

FIG. 3 shows simplified plot 80 of the variation of LDMOS device breakdown trigger voltage Vt1 as a function of the gate-source voltage Vgs of an LDMOS device. The trigger voltage Vt1 is the source-drain voltage at which the LDMOS device enters breakdown wherein source-drain current rapidly increases. As shown by line 82, the trigger voltage Vt1 at which breakdown occurs is a function the gate-source voltage Vgs. Vt1 increases with decreasing Vgs and decreases with increasing Vgs, having its highest value 81 at Vgs=0.

Figure 4:
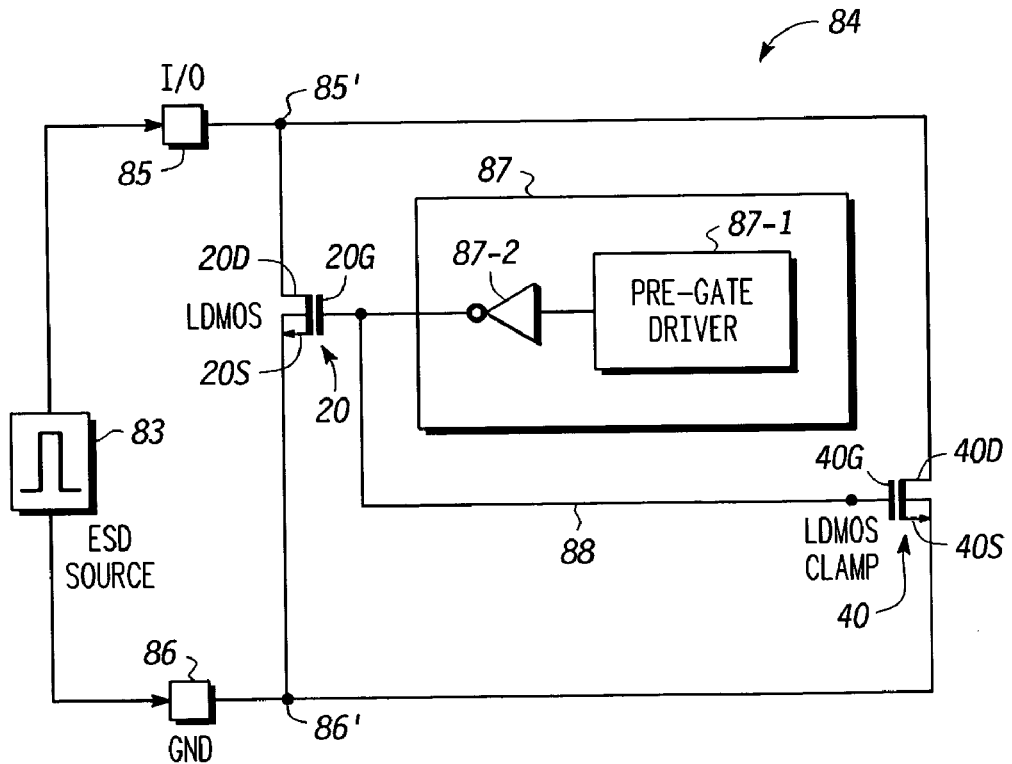
FIG. 4 is a simplified schematic circuit diagram showing the ESD protection device of the present invention coupled to the LDMOS device that it protects.

FIG. 4 shows simplified schematic circuit 84 illustrating how LDMOS ESD clamp device 40 of the present invention is coupled to LDMOS device 20 that it protects. ESD transient source 83 is assumed to be coupled to I/O and GND contacts 85, 86 respectively. LDMOS device 20 is coupled across nodes 85', 86' which are connected to I/O 85 and GND 86 respectively. Drain contact 20D (contact 56 in FIG. 1) is coupled to node 85' and source contact 20S (contact 54 in FIG. 1) is coupled to node 86'. LDMOS ESD protection device 40 is also coupled across nodes 85', 86', with drain contact 40D (contact 56' in FIG. 2) coupled to node 85' and source contact 40S (contact 54 in FIG. 2) coupled to node 86'. Thus, the sources and drains of devices 20 and 40 are effectively in parallel. Whatever ESD transient voltage appears at terminals 85, 86, also substantially appears across the source-drains of both device 20 and device 40. For convenience of description, the lead resistances are neglected. In general they are small enough compared to the device impedances that, in most cases, they may be neglected. Persons of skill in the art will understand how to take them into account if that is needed. As already explained in connection with FIGS. 1-2, the internal drain contacts to the two devices are different.

Conventional driver circuit 87 provides the drive voltage for normal operation of LDMOS device 20. Driver circuit 87 conveniently comprises pre-gate driver 87-1 and amplifier 87-2, but this is not essential. Any type of driver suitable for use with LDMOS device 20 in the frequency range and for the desired power output may be used. Gate 20G of device 20 and gate 40G of device 40 are coupled together as shown by lead 88. Again, for convenience of explanation, the resistance of lead 88 is neglected. Additional resistance may also be included in lead 88 but that is not essential and is preferably omitted. Coupling gates 20G and 40G insures that Vgs of devices 20 and 40 is the same, even during an ESD transient applied to the source-drains of these devices via node 86', 85'. As will be explained more fully in connection with FIG. 5, the differences in properties of devices 20 and 40 insure that $Vt1_{40}$ is less than $Vt1_{20}$ so that device 40 always turns on before device 20, thereby protecting device 20 from ESD transient 83. Further, the inequality $Vt1_{40} < Vt1_{20}$ is maintained despite process variations that affect the dimensions and junctions of devices 20, 40 since Vt1 values of device 40 and device 20 will track. The source, drain, and gate of protecting device 40 are coupled respectively to the source, drain and gate of protected device 20. Thus, protecting device 40 and protected device 20 are coupled in parallel, with or without series lead resistance taken into account. However, the location of the drain contact on device 40 differs from the location of the drain contact on device 20.

Figure 5:
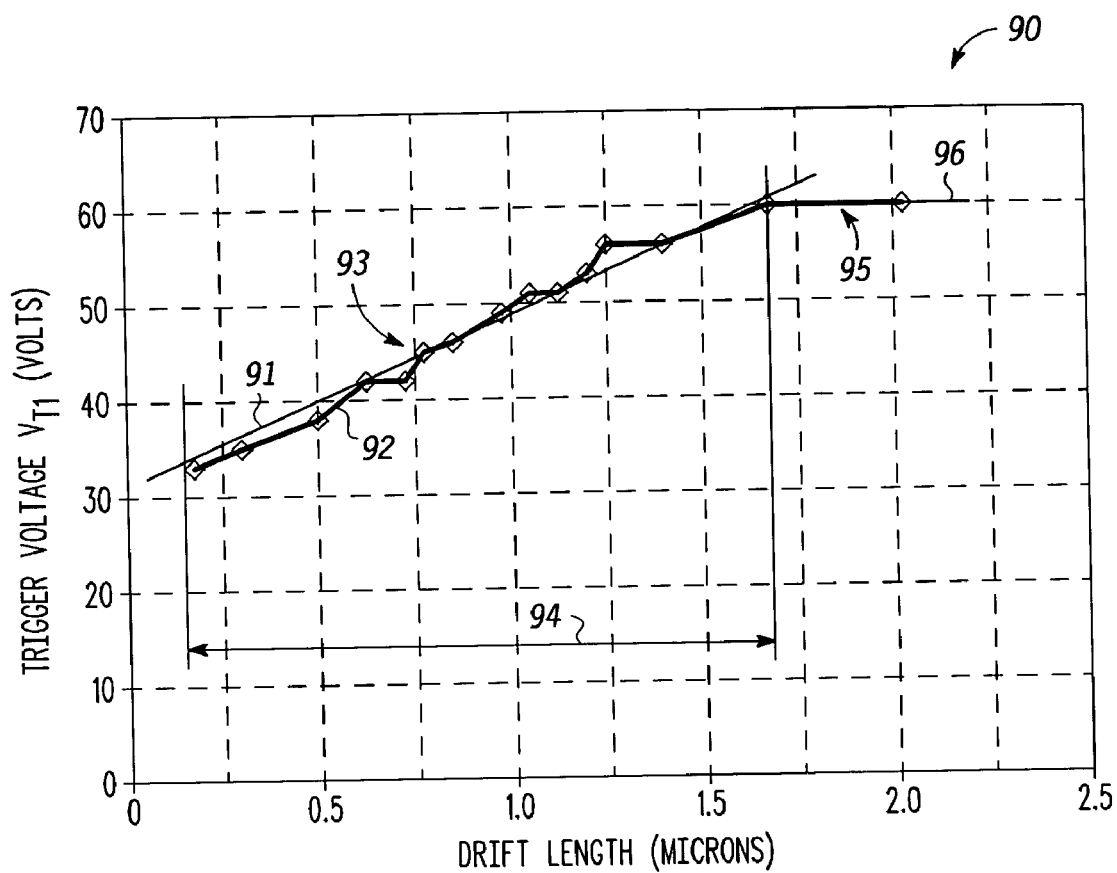
FIG. 5 is a plot of trigger breakdown voltage Vt1 as a function of drift length for the LDMOS ESD device of the present invention.

FIG. 5 shows plot 90 of breakdown trigger voltage Vt1 as a function of drift length (abbreviated as "DL") 64, 66 for LDMOS devices 20, 40 of the present invention. Curve 92 shows the result of measuring Vt1 for different drift lengths 64 or 66 on otherwise identical LDMOS devices. Roughly from about 0.25 microns to about 1.7 microns drift length (region 93, 94 of FIG. 5), Vt1 increases approximately linearly with drift length (DL) 64, a shown by line 91. Above about DL~1.7 microns in region 95 of curve 92, Vt1 is approximately constant as shown by line 96. This shows that drift length 64, 66 can be used to set Vt1 and if the devices are sized to operate in region 94, device 40 can be arranged to always have $Vt1_{40} < Vt1_{20}$. For example, line 91 approximately describes the behavior of Vt1 versus DL in region 94, that is, $$Vt1 \sim 18*(DL) + 31 \text{ or} \qquad [1]$$

$$DL \sim (Vt1 - 31)/18, \qquad [2]$$

where Vt1 is in volts and DL is in microns. Suppose that it is desired that device 20 have a $Vt1_{20}$ value of about 50 volts. This corresponds to having drift length (DL) 64 of just over a micron. Suppose further that it is desired to have $Vt1_{40}$ be about 5 to 6 volts lower so as to provide a reasonable guard-band whereby device 40 enters breakdown at $Vt1_{40}$ of ~50−6=~44 volts. This corresponds to having drift length (DL) 66 of about ~0.7 microns. With this arrangement wherein $DL_{40} < DL_{20}$, ESD device 40 will always enter breakdown at a lower voltage and thereby act as a clamp to protect LDMOS device 20 from an ESD transient. Expressed another way, it is desirable that drift length 66 of device 40 (abbreviated as $DL_{40}$) be smaller than drift length 64 of device 20 (abbreviated as $DL_{20}$) according to the relationship:

$$DL_{40} = m * DL_{20} \qquad [3]$$

where m is usefully in the range $0.4 \leq m \leq 1.0$, conveniently about $0.5 \leq m \leq 0.9$ and preferably about $0.6 \leq m \leq 0.8$. In the example given above with $Vt1_{20}$ 50 volts and $Vt1_{40}$~44 volts, m is about 0.7.

Since drift lengths (DLs) 64, 66 are set by masks used in forming both device 20 and 40 at the same time, process variations, tend to affect both devices 20 and 40 in the same direction. For example, if process variation causes dimension 64 to be undersized, say about $DL_{20}$~0.9 microns instead of ~1.0 microns, then dimension $DL_{40}$ which is formed during the same process operations, will be undersized by a similar amount (e.g., $DL_{40}$~0.6 microns instead of ~0.7 microns). So, even though $Vt1_{20}$ drops to about 47 volts as a result of the shorter drift length, $Vt1_{40}$ drops to about 41 volts because its drift length is also correspondingly reduced. As a consequence, a useful guard-band is still maintained and device 40 continues to adequately protect device 20. Thus, the present invention not only makes it possible to chose the desired guard-band for the protective EDS device, but also to continue to provide a useful guard-band even in the face of process variations. This is a very significant advantage, since it substantially reduces or eliminates the manufacturing yield loss previously encountered due to process-induced variations in the ESD and/or the LDMOS breakdown voltage. This is a particular feature of the present invention. While, the exemplary guard-band of 5 to 6 volts is useful, larger or smaller guard-bands can also be used, as long as operation extends into region 94 of FIG. 5 wherein Vt1 varies with drift lengths 64, 66 for devices 20, 40.

Figure 6:
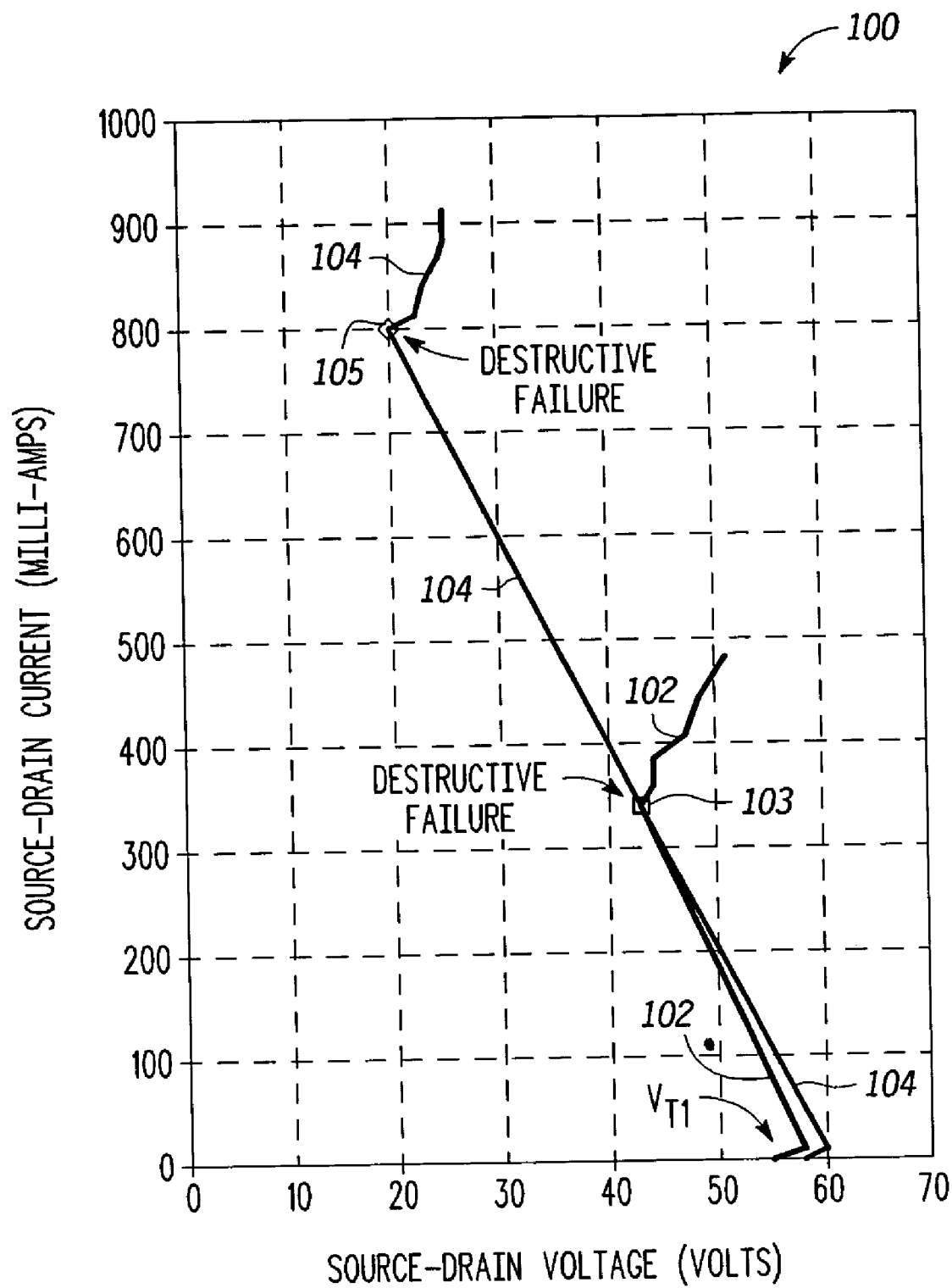
FIG. 6 is a plot of source-drain breakdown current as a function of source-drain voltage for the LDMOS ESD protection device of the present invention and a conventional LDMOS device of substantially the same dimensions.

FIG. 6 shows plot 100 of source-drain current as a function of source-drain voltage for: (i) LDMOS ESD protection device 40 of the present invention (trace 104) and (ii) conventional LDMOS device 20 of substantially the same dimensions (trace 102). Both devices have about the same nominal drift lengths 64, 66 and about the same trigger voltage Vt1 in the range of ~57-60 volts. Trace 102 shows the results for conventional LDMOS device 20, which enters destructive failure at about 350 milliamps at point 103. Trace 104 shows the results for ESD LDMOS device 40, which enters destructive failure at about 800 milliamps at point 105, more than twice the current tolerance of device 20. These devices had the same device width, that is, the dimension perpendicular to the plane of FIGS. 1-2 and nominally the same drift lengths 64, 66. They differed in that device 40 used N(ISO) contact 50 as its drain contact 56'.

The difference in destructive current tolerance can be more easily understood by reference to FIGS. 1-2. In conventional LDMOS device 20, the source-drain current flows close to surface 75, approximately as shown by arrow 70. The greatest thermal dissipation occurs typically near the drain contact, that is, where current 70 enters $N^{++}$ region 48 near surface 75. With increasing current, this very thin region near surface 75 quickly reaches destructive high temperatures and the device fails catastrophically. In device 40, parasitic NPN transistor 68 switches on during breakdown. $N^{++}$ region 48 no longer functions as the drain contact because there is no current carrying lead thereto. Drain contact 56' uses N(ISO) contact 50. Hence, the source-drain current now must flow into the bulk of the device as indicated, for example, by arrow 72, since it must return to N(ISO) contact 50 (drain contact 56') via $N^+$ buried layer 24 and N region 30. Thus, the surface concentration of current observed in conventional LDMOS device 20 is avoided and a much larger current can be conducted before local heating reaches destructive levels. Thus, the invented ESD device arrangement provides thermal advantages that allow the size of the ESD device to be reduced for the same current carrying capacity thereby further increasing manufacturing yield. For example, if the ESD devices on a chip can be made smaller for the same performance, then the resulting IC die can be made smaller and more die obtained per wafer processed. This translates into a direct cost reduction with no sacrifice in performance. Alternatively, for the same ESD device area, the ESD current tolerance can be more than doubled, providing much more robust ESD protection. Persons of skill in the art will understand based on the description herein that various trade-offs can also be made so as to obtain an optimum combination of reduced area and improved current handling capability.

It was noted in paragraph (iv) above, that isolation-body well separation (IBS) 62 between deep N region 30 and $P^−$ well 34 is desirably but not essentially made larger than corresponding separation 60 of device 20 of FIG. 1. A series of tests was run measuring the impact on device properties of varying separation 62, while other things were kept substantially the same. For example, with substantially constant drift lengths and IBS values of 2, 10 and 20 microns, Vt1 did not change significantly, but the destructive failure points (e.g., points 103, 105 of FIG. 6) changed significantly. Increasing IBS provides significantly greater destructive failure currents while still providing similar values of Vt1. Having higher destructive failure currents is very desirable. Thus, dimension 62 (hereafter $IBS_{40}$) is desirably related to dimension 60 (hereafter $IBS_{20}$) according to the relation ship:

$$IBS_{40} = n * IBS_{20} \qquad [4]$$

where n usefully lies in the range $1 \leq n \leq 10$, conveniently in the range $1 \leq n \leq 5$ and more conveniently in the range of about $1.5 \leq n \leq 3$ and preferably about 2.5. This provides further control over ESD protection of devices made at the same time on the same substrate using the same process, and enables favorable trade-offs in device properties (e.g., device area versus current tolerance, etc.). This is another particular feature of the present invention.

Stated another way, an ESD protected LDMOS device according to a first embodiment of the present invention comprises a first LDMOS device having source region, drain region, gate, first body well region containing the source region, second body well region containing the drain region and separated from the first body well region by a drift region, and an isolation region surrounding but separated from the first and second body well regions, and a second LDMOS device having source region, drain region, gate, first body well region containing the source region, second body well region containing the drain region and separated from the first body well region by a drift region, and an isolation region surrounding but separated from the first and second body well regions and a further region of the same conductivity type as the drain region, coupling the drain region to the isolation region, wherein the source region and gate of the first device are coupled, respectively, to the source region and gate of the second device, and wherein the drain region of the first device is coupled to the isolation region of the second device.

In a further embodiment, an apparatus is provided for ESD protection, comprising, two parallel coupled LDMOS devices, one being a protected device and the other a protecting device, wherein each device has source region, drain region, gate, first body well region containing the source, second body well region containing the drain and separated from the first body well region by a drift region, an isolation region separated from the first and second body well regions and a buried layer contacting the isolation region, and wherein the protecting device has a further region of the same type as the drain region, coupling the drain region to the isolation region, and its drain connection is made via a contact to the isolation region rather than the drain region. In a preferred embodiment, the drift region of the protecting device is smaller than the drift region of the protected device.

ESD protection is conveniently obtained by the method comprising, providing a first LDMOS device having spaced-apart source and drain regions separated by a first drift region of length $DL_1$ overlain with a gate region and underlain by a buried layer and laterally surrounded by and separated from an isolation region in contact with the buried layer, said first device being the protected device, and simultaneously providing a second LDMOS device having spaced-apart source and drain regions separated by a second drift region of length $DL_2<DL_1$ overlain with a gate region and underlain by a buried layer and laterally surrounded by and separated from an isolation region in contact with the buried layer, and further having a region of the same conductivity type as the drain region coupling the drain region to the isolation region, said second device being the protecting device, and then electrically coupling the source and gate of the first device to the source and gate, respectively, of the second device and the drain of the first device to the isolation region of the second device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An ESD protected LDMOS device, comprising:
   a first LDMOS device having source region, drain region, gate, first body well region containing the source region, second body well region containing the drain region and separated from the first body well region by a drift region, and an isolation region surrounding but separated from the first and second body well regions;
   a second LDMOS device having source region, drain region, gate, first body well region containing the source region, second body well region containing the drain region and separated from the first body well region by a drift region, and an isolation region surrounding but separated from the first and second body well regions and a further region of the same conductivity type as the drain region, coupling the drain region to the isolation region;
   wherein the source region and gate of the first device are electically connected, respectively, to the source region and gate of the second device such that the first and second LDMOS devices are parallel coupled; and
   wherein the drain region of the first device is electrically connected to the isolation region of the second device.

2. The device of claim 1 wherein:
   the drift region of the first device has dimension $DL_1$;
   the drift region of the second device has dimension $DL_2$; and
   $DL_2<DL_1$.

3. The device of claim 1 wherein:
   the drift region of the first device has dimension $DL_1$;
   the drift region of the second device has dimension $DL_2$; and
   $DL_2=m*DL_1$, where m is in the range $0.4 \leq m \leq 1.0$.

4. The device of claim 3 wherein m is in the range $0.5 \leq m \leq 0.9$.

5. The device of claim 4 wherein m is in the range $0.6 \leq m \leq 0.8$.

6. The device of claim 1 wherein:
   the isolation region of the first device is separated from the first body well region of the first device by a dimension $IBS_1$;
   the isolation region of the second device is separated from the first body well region of the second device by a dimension $IBS_2$; and
   $IBS_2=n*IBS_1$, where n is in the range $1 \leq n \leq 10$.

7. The device of claim 6 wherein n is in the range $1 \leq n \leq 5$.

8. The device of claim 6 wherein n is in the range $1.5 \leq n \leq 3$.

9. The device of claim 1 wherein in the second device the drain region is coupled to the isolation region by a buried layer.

10. An apparatus is provided for ESD protection, comprising:
    two parallel coupled LDMOS devices, one being a protected device and the other a protecting device;
    wherein each device has source region, drain region, gate, first body well region containing the source, second body well region containing the drain and separated from the first body well region by a drift region, an isolation region separated from the first and second body well regions and a buried layer contacting the isolation region; and
    wherein the protecting device is distinguishable from the protected device in that the protecting device has a further region of the same type as the drain region, electrically connecting the drain region to the isolation region, and in that the drain connection of the protected device is connected to the isolation region of the protecting device rather than the drain region of the protecting device.

11. The apparatus of claim 10 wherein the drift region of the protecting device is smaller than the drift region of the protected device.

12. The apparatus of claim 10 wherein:

the drift region of the protected device has a dimension $DL_1$;

the drift region of the protecting device has a dimension $DL_2$; and $DL_2 < DL_1$.

13. The apparatus of claim 10 wherein:

the drift region of the protected device has a dimension $DL_1$;

the drift region of the protecting device has a dimension $DL_2$; and $DL_2 = m*DL_1$, where m is in the range $0.4 \leq m \leq 1.0$.

14. The apparatus of claim 13 wherein m is in the range $0.5 \leq m \leq 0.9$.

15. The device of claim 14 wherein m is in the range $0.6 \leq m \leq 0.8$.

16. The apparatus of claim 10 wherein the isolation-first body well separation of the protecting device is larger than the isolation-first body well separation of the protected device.

17. The apparatus of claim 10 wherein:

the isolation region of the protected device is separated from the first body well region of the protected device by a dimension $IBS_1$;

the isolation region of the protecting device is separated from the first body well region of the protecting device by a dimension $IBS_2$; and $IBS_2 = n* IBS_1$, where n is in the range $1 \leq n \leq 10$.

18. The apparatus of claim 17 wherein n is in the range $1 \leq n \leq 5$.

19. The apparatus of claim 17 wherein n is in the range $1.5 \leq n \leq 3$.

* * * * *

UNITED STATES PATENT AND TRADEMARK OFFICE
CERTIFICATE OF CORRECTION

PATENT NO. : 7,368,786 B2 Page 1 of 1
APPLICATION NO. : 11/078026
DATED : May 6, 2008
INVENTOR(S) : Hongzhong Xu et al.

It is certified that error appears in the above-identified patent and that said Letters Patent is hereby corrected as shown below:

Column 8, line 22, "electically" should be changed to --electrically--;

Signed and Sealed this

Fifteenth Day of July, 2008

JON W. DUDAS
*Director of the United States Patent and Trademark Office*